United States Patent [19]

Axell

[11] Patent Number: 4,715,821

[45] Date of Patent: Dec. 29, 1987

[54] COAXIAL PLUG FOR USE IN A JUNCTION BETWEEN A COAXIAL CONDUCTOR AND A STRIPLINE

[75] Inventor: Claes E. S. Axell, Askim, Sweden

[73] Assignee: Telefonaktiebolaget L M Ericsson, Stockholm, Sweden

[21] Appl. No.: 901,126

[22] Filed: Aug. 28, 1986

[30] Foreign Application Priority Data

Oct. 3, 1985 [SE] Sweden ................................ 8504588

[51] Int. Cl.[4] ................................................ H05K 1/00

[52] U.S. Cl. ........................................ 439/59; 439/63; 439/83; 439/101

[58] Field of Search .......... 339/17 C, 17 LC, 17 LM, 339/17 M, 17 F, 17 CF, 17 N, 177 R, 177 E, 143 R, 275 B, 14 R, 14 P; 333/246, 260, 33

[56] References Cited

U.S. PATENT DOCUMENTS 3,325,752 6/1967 Barker ................................ 333/260
3,539,966 11/1970 Logan ................................ 333/260
3,686,624 8/1972 Napoli et al. ....................... 333/260
4,280,112 7/1981 Eisenhart ........................... 333/260
4,487,999 12/1984 Baird et al. ..................... 339/177 R
4,507,708 3/1985 Lindberg ............................ 333/260

FOREIGN PATENT DOCUMENTS 0032402 2/1985 Japan .................................. 333/246

*Primary Examiner*—Gil Weidenfeld
*Assistant Examiner*—David Pirlot
*Attorney, Agent, or Firm*—Burns, Doane, Swecker & Mathis

[57] ABSTRACT

A coaxial plug for use in a junction between a coaxial conductor located externally of an apparatus box and a stripline with a conductive ground plane located within the box. The stripline and ground plane are arranged on a respective side of an insulating plate. A center pin of the coaxial plug is for connection with the stripline and a conductive outer casing of the coaxial plug is for connection with the ground plane. An impedance - correct junction, which is short in relation to the wavelength of the transmitted signal, can be obtained without the need to solder or glue the conductors. The coaxial plug is provided with an outwardly protruding part which extends from one end wall of the plug in contact with the conductive outer casing thereof and which presents an at least substantially planar surface which enables connections in the junction to be made by so-called bonding techniques. The plug may also comprise two parts, of which one is a standard plug, and the other is an intermediate component intended for use between the standard plug and the stripline with its ground plane to which the plug is to be connected.

9 Claims, 11 Drawing Figures

COAXIAL PLUG FOR USE IN A JUNCTION BETWEEN A COAXIAL CONDUCTOR AND A STRIPLINE

TECHNICAL FIELD

This invention relates to a coaxial plug for use in a junction between a coaxial conductor located externally of an apparatus box and a stripline located within the box and having a conductive earthing plane, or surface, the stripline and earthing plane being arranged on a respective side of an insulating plate, and the centre pin of the plug being intended for connection with the stripline, and the conductive outer casing of the plug being intended for connection with the earthing plane or surface.

BACKGROUND ART

Reflection phenomena occur when the impedance of the junction, or transition, between a coaxial plug and a stripline according to the above is incorrect. In order for the junction to have correct impedance, it is necessary for the junction to exhibit at each cross-section thereof the same characteristic impedance as that of coaxial conductor and the stripline with its earthing plane. An impedance-correct junction is difficult to achieve, however, for reasons of a practical and mechanical nature.

When the length of the junction is considerably shorter than the wavelength of the transmitted signal, it is possible to use a junction with incorrect impedance without reflection becoming unacceptably high. In this regard the length of the junction should be at most 5–10% of the wavelength of the signal, which in the case of a 30 GHz-signal, the wavelength of which on a substrate having a high dielectric constant is about 3 mm, means that the junction should have at maximum a length of some tenths of a millimeter. The greatest problem encountered in the construction of a junction according to the foregoing is one of providing a short earthing plane junction in relation to wave-length, i.e. a short connection between the outer casing of the coaxial conductor and the earthing plane associated with the stripline.

One conceivable method is to solder or glue metal foil onto the earthing plane (surface) and onto a part of the earthing wire of the coaxial plug, the earthing wire being placed around (although not in contact with) the central pin on the transverse wall of the plug. This method, however, is unsuitable when the stripline is located within a hermetically sealed apparatus box together with non-encapsulated chips, since glue gives off gases which are liable to damage the chips, and since soldering gives rise to problems related to flux residues. Consequently, glue should not be used at all, and welding, when carried out, should be done prior to mounting the chips. In certain contexts, inter alia when the electrical equipment is to be used in satellites or space vehicles, manufacturing methods and materials, e.g. synthetic resins, which are liable to produce deleterious gases are sometimes not allowed at all.

The conventional method of obtaining an earthing plane junction would seem to be one which involves the use of the metallic connection extending between the earthing plane of the stripline and the bottom of the apparatus box. This results, however, in long and unsafe earthing plane connections which have incorrect impendance. In addition, problems are caused by the mutually different coefficients of linear expansion of a hard substrate, e.g. a ceramic, and the apparatus box, causing the substrate to crack readily. A soft substrate, e.g. teflon, is more durable than a hard substrate, but cannot be used in hermetically sealed apparatus boxes due to the aforesaid generation of gases.

SUMMARY OF INVENTION

The objective of the present invention is to provide a coaxial plug of the aforesaid kind which enables a junction to be obtained which is of the correct impedance and short in relation to the wavelength of the transmitted signal without needing to use glue or synthetic resin materials. In addition, it shall be possible to connect the coaxial plug to the stripline without damaging non-encapsulated chips previously connected to the stripline. This is achieved by providing the coaxial plug with an outwardly projecting part which extends from the plug in the axial direction thereof in contact with the outer casing of the plug and which presents at least one substantially planar surface therewith to enable the connections in the junction to be made with the aid of bonding techniques.

The characterizing features of the invention are set forth in the following description and claims.

BRIEF DESCRIPTION OF DRAWINGS

The invention will now be described in more detail with reference to a number of embodiments thereof illustrated in the accompanying drawings, in which.

BEST MODES FOR CARRYING OUT THE INVENTION

Figure 2:
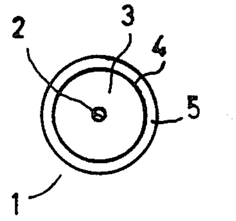
Fig. 2 (PRIOR ART)
FIGS. 1 and 2 are, respectively, a side view and an end view of a known coaxial plug.
Figure 1:
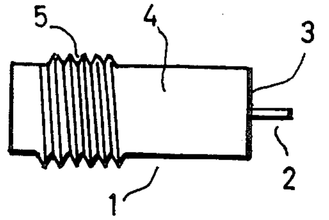
Fig. 1 (PRIOR ART)

FIGS. 1 and 2 illustrate in side view and end view respectively a conventional cylindrical coaxial plug 1 of the so-called spark plug type. The plug comprises a centre pin 2, a dielectric 3 and an electrically conductive outer casing 4, provided with a screwthreaded part 5.

Figure 4:
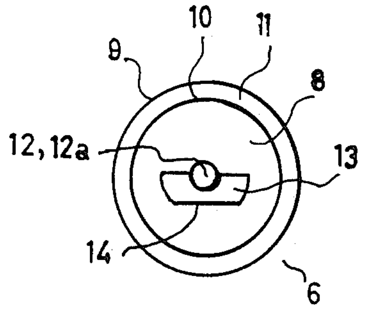
FIGS. 3 and 4 are respectively a side view and an end view of a sleeve-like component according to the present invention intended for use as an intermediate component between the coaxial plug illustrated in FIGS. 1 and 2 and a stripline.
Figure 3:
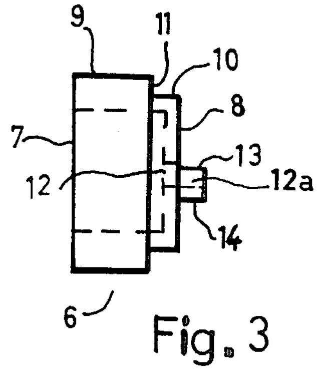

FIGS. 3 and 4 are a respective side view and an end view of a cylindrical sleeve-like component 6 according to the invention. The component 6 is made of metal and is intended for use as an intermediary between a coaxial plug of the kind illustrated in FIGS. 1 and 2 and a strip-line located in an apparatus box. The intermediate component 6 is open at one end 7 thereof, while the other carries an end wall 8. The reference numerals 9 and 10 respectively designate a broad and a narrow part of the sleeve-like component, and the reference numeral 11 designates the annular transverse wall formed at the juncture between these two parts. The axial length of the narrower part 10 preferably coincides with the thickness of the apparatus-box wall in which the strip-line to be connected with an external coaxial cable is located. The broken lines in FIG. 3 indicate the inner walls of the sleeve-like component, these walls forming a cylinder having an end wall at its one end. The sleeve-like component thus has a uniform internal diameter along the whole of its length. This diameter is somewhat larger than the diameter of the coaxial plug 1 to which the aforesaid component is to be connected. The internal length of the sleeve-like component is somewhat shorter than the distance between the end wall of the plug 1, from which the centre pin 2 projects, and the end of the screwthreaded plug part 5 facing the end wall (FIG. 1). When the coaxial plug is inserted into the intermediate component, the central pin will project slightly through a hole 12 located in the centre of the end wall 8. The intermediate member 6 also has a part 13 which projects from the outer surface of the end wall 8 in the axial direction of said intermediate component. The part 13 has an essentially flat configuration, presenting a planar surface 14, and in one practical embodiment projects approximately 6 mm from the end wall 8. The part 13 may have a width of about 3 mm. The hole or aperture 12 in the end wall 8 continues into the part 13 as a groove 12*a*. THe hole 12 and the groove 12*a* are dimensioned so as to form, together with the centre pin of the coaxial plug, a conductor having a characteristic conductor-impendance which coincides with that of the plug.

Figure 6:
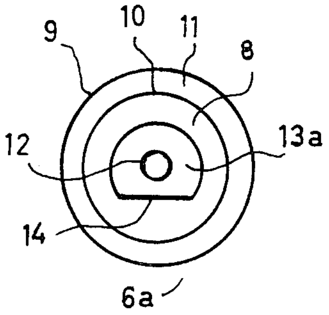
FIGS. 5 and 6 illustrate an alternative embodiment of the sleeve-like component according to FIGS. 3 and 4.
Figure 5:
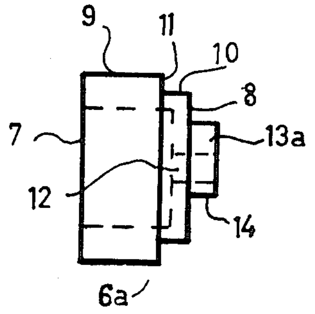

An alternative embodiment of the sleeve-like component 6 (the intermediate component) shown in FIGS. 3 and 4 is illustrated in FIGS. 5 and 6, in which the sleeve-like component is referenced 6a and corresponding elements are designated by the same reference numerals as those used in the preceding Figures. The difference between the FIGS. 3 and 4 embodiment of the intermediate component and the FIGS. 5 and 6 embodiment is that with the intermediate component of this latter embodiment the outwardly projecting part, here reference 13*a*, is located around the hole 12. The intermediate component of the FIGS. 5 and 6 also presents the aforesaid planer surface 14 however. The hole 12 continues through the part 13*a* and is dimensioned so as to form, together with the centre pin of the coaxial plug, a coaxial conductor having the same characteristic conductor-impedance as the plug.

Figure 7:
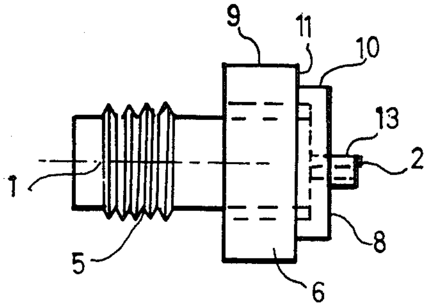
FIG. 7 illustrates a coaxial plug according to FIGS. 1 and 2 connected to a sleeve-like component according to FIGS. 3 and 4.

FIG. 7 illustrates a coaxial plug according to FIGS. 1 and 2 connected to a sleeve-like intermediate component according to FIGS. 3 and 4. In this case, the coaxial plug is inserted into the intermediate component 6 with one end wall of the plug in abutment with the inner surface of the end wall 8 of the component. The centre pin of the plug suitably terminates edge-to-edge with the distal end surface of the outwardly projecting part 13, as seen from the plug, although it may, for example, optionally extend beyond said distal end surface. The assemblies, plug and component, are intended to be, e.g., soldered together, as explained hereinafter. The narrower part 10 of the intermediate component is intended to be placed into and secured in an aperture which extends through a wall of the apparatus box such that annular transverse wall 11 abuts the outer surface of the wall.

Figure 8:
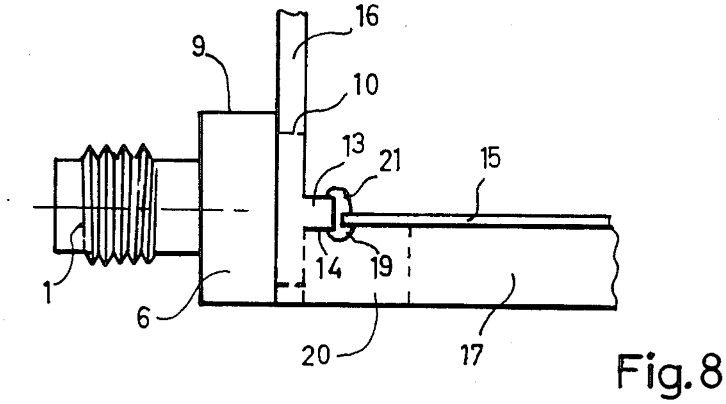
FIG. 8 is a side view of the plug and the sleeve-like component according to FIG. 7, the sleeve-like component also being connected to a stripline in an apparatus box.
Figure 9:
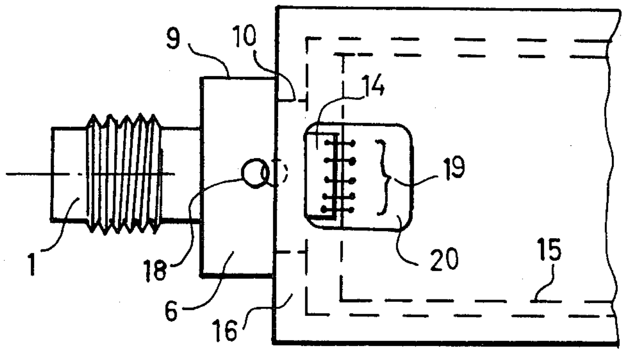
FIG. 9 illustrates the arrangement according to FIG. 8 seen from beneath the box externally thereof.

FIGS. 8 and 9 illustrate the coaxial plug 1 and the intermediate component 6 according to FIG. 7, the intermediate component also being connected to a strip-line in an apparatus box. FIG. 8 illustrates the arrangement in side view, whereas FIG. 9 is a view taken from the outer under surface of the box. The box walls and bottom are referenced 16 and 17 respectively. The strip-line is located in the upper side of an insulating plate 15, as illustrated in FIG. 8, the opposite side (the lower), of which plate incorporates a conductive earthing plane attached to the box bottom. The intermediate component 6 is secured in the apparatus box with the aid, e.g., of a solder joint, with the narrower part 10 of the component located in a through-passing aperture in the wall 16 and with the annular transverse wall 11 of said component in abutment with the outer surface of the wall, as described above. To this end, the intermediate component 6 is conveniently provided with two diametrically opposed holes in the proximity of the end wall 8, through which holes a soldering compound can be introduced, such as to secure the intermediate member to the box wall 16 and to secure the plug 1 in the intermediate component. One of these holes is referenced 18. The end wall 8 of the component 6 lies opposite the inner surface of the wall 16 and the outwardly projecting shoulderlike part 13 thus protrudes slightly into the box. Consequently, the plate 15 must either be spaced from the wall 16 or provided with a recess for accomodating the outwardly projecting part 13.

The earthing plane, or surface, is bonded to the planar surface 14 of the outwardly projecting part 13 with the aid of a plurality of so-called bonding wires 19. These are affixed by means of a bonding process in which two points are mutually connected by pressing a conductive material, e.g. gold or aluminium, onto the first point while applying high pressure and optionally also heat, whereafter the conductive material, in the form of thin wire or strip, is pressed against the second point. This bonding process results in molecular adhesion and can be used with advantage in the vicinity of non-encapsulated chips, since it obviates the need of glue or soldering materials, which may be liable to damage the chips.

Optionally, the bond in the earthing plane junction can be effected with a single bonding wire, instead of a plurality of wires. The bond connections may also be effected with strips or bands, instead of with wire. Neither is it necessary for the surface 14 to be completely planar in order for the bond connections to be affixed thereto, but may be slightly curved for example. An aperture 20 is formed through the bottom of the box, adjacent a box wall, in order to facilitate attachment of the bonding wires. This aperature can be sealed with a further bottom plate, which is secured to the box in a known manner, e.g. by laser welding. The centre pin of the coaxial plug is connected with the conductor on the upper surface of the insulating plate with the aid of one or more bonding wires 21.

Figure 10:
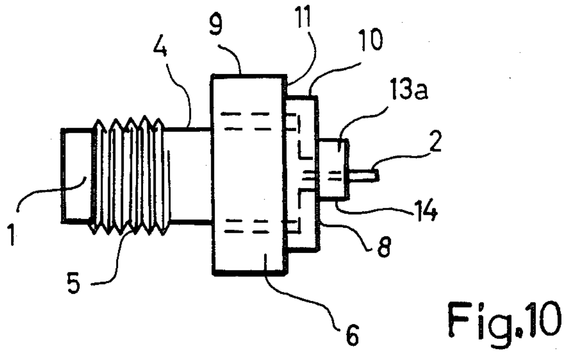
FIG. 10 illustrates a coaxial plug according to FIGS. 1 and 2 connected to a sleeve-like component according to FIGS. 5 and 6.

FIG. 10 illustrates a coaxial plug according to FIGS. 1 and 2 connected to a sleeve-like intermediate component according to FIGS. 5 and 6. The resultant assembly differs from the corresponding assembly illustrated in FIG. 7, insomuch as the centre pin of the coaxial plug projects out through the hole in the outwardly projecting part 13a which, as mentioned, is located around the pin.

Figure 11:
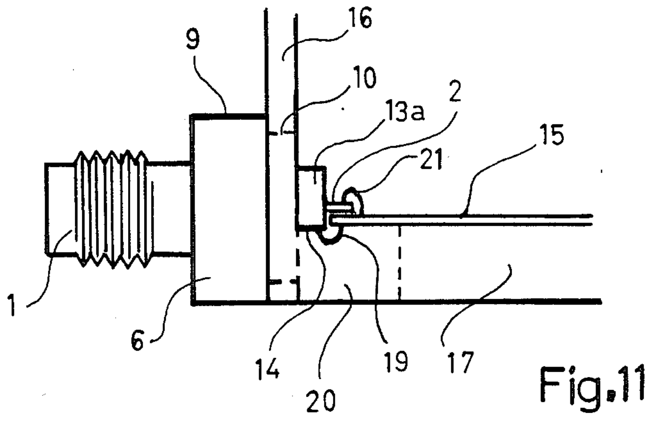
FIG. 11 is a side view of the plug and the sleeve-like component according to FIG. 10, the component of this embodiment also being connected to a stripline in an apparatus box.

FIG. 11 shows the assembly of FIG. 10 connected to a stripline in an apparatus box. The arrangement is shown in side view and differs from the corresponding arrangement of FIG. 8, insomuch as the centre pin of the plug projects slightly over the stripline on the plate 15. When seen from beneath, this arrangement has essentially the same appearance as the arrangement illustrated in FIG. 9.

The illustrated bond connections between the coaxial plug and the stripline a junction which is short and has a correct impedance, this bond being achieved without the need of soldering subsequent to mounting the components, e.g. non-encapsulated chips, in the box. In addition, the relative movement between the box and the stripline resulting from the mutually different thermal expansion coefficients are taken-up by the bonding wires.

Modifications can be made within the scope of the following claims. For example, the coaxial plug may be of a kind different to that illustrated. One example in this regard resides in the type of plug having a plate in the end thereof from which the centre pin extends. It will be understood that in this case the intermediate component must also be given a flat side surface commensurate with this form of plug.

The coaxial plug and the intermediate component may also have the form of a single unit, i.e. the form of a coaxial plug having the same external configuration as for example, the interconnected assemblies illustrated in FIGS. 7 and 10.

In the case of less stringent cleanliness requirements, e.g. in the absence of encapsulated chips, other connections than bond connections may, of course, be used.

What is claimed is:

1. A coaxial plug for use between a coaxial conductor located externally of an apparatus box and a stripline with a conductive ground plane located within the box, comprising:

an insulating plate, the stripline and ground plane each being located on a respective side of said plate;

an end wall on said coaxial plug;

means for connection with the stripline, said means being a centre pin in said coaxial plug;

means for connection with said ground plane, said means being a conductive outer casing of said coaxial plug;

a projecting part of said coaxial plug projecting outwardly from said end wall and in contact with said conductive outer casing, said centre pin and said projecting part terminating substantially edge-to-edge at substantially equal distances from said end wall and adjacent said insulating plate; and planar surface means included on said projecting part at a location remote from said centre pin for bonded connections between said centre pin and the stripline and between said planar surface means and the ground plane, respectively.

2. A coaxial plug according to claim 1, wherein the outwardly projecting part comprises a subsantially rectangular plate having a U-shaped groove formed therein through which the centre pin protrudes free of contact with the groove.

3. A coaxial plug according to claim 1, wherein the outwardly projecting part surrounds the centre pin and has a hole formed therein through which the pin protrudes free of contact with the hole.

4. A coaxial plug according to claim 1, wherein the centre pin and the projecting part are of a structure sufficient to form a conductor having impedance substantially the same as the impedance of the plug.

5. A coaxial plug according to claim 1, wherein the plug comprises two parts, one part comprising a standard plug and the other part comprising a component intended for use as an intermediary between the standard plug and the stripline with the conductive ground plane with which the coaxial plug is to be connected.

6. A coaxial plug according to claim 5, wherein said other part is of sleeve-like construction so as to fit cylindrical standard plug.

7. A coaxial plug according to claim 1, wherein the end wall comprises a conductive circular plate having a hole formed therein through which the centre pin protrudes free of contact with the hole.

8. A coaxial plug according to claim 7, wherein the outwardly projecting part comprises at least a substantially rectangular plate having a U-shaped groove formed therein through which the centre pin protrudes free of contact with the groove.

9. A coaxial plug according to claim 7, wherein the outwardly projecting part surrounds the centre pin and has a hole formed therein through which the pin protrudes free of contact with the hole.

* * * * *